(12) United States Patent
Strasser

(10) Patent No.: US 7,550,854 B2
(45) Date of Patent: Jun. 23, 2009

(54) INTEGRATED INTERCONNECT ARRANGEMENT

(75) Inventor: Rudolf Strasser, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 214 days.

(21) Appl. No.: 10/514,145

(22) PCT Filed: Mar. 19, 2003

(86) PCT No.: PCT/EP03/50070

§ 371 (c)(1),
(2), (4) Date: Feb. 13, 2006

(87) PCT Pub. No.: WO03/096419

PCT Pub. Date: Nov. 20, 2003

(65) Prior Publication Data

US 2006/0202338 A1  Sep. 14, 2006

(30) Foreign Application Priority Data

May 8, 2002  (DE) ................ 102 20 653

(51) Int. Cl.
*H01L 23/48*  (2006.01)
*H01L 23/52*  (2006.01)

(52) U.S. Cl. ............. 257/776; 257/531; 257/664; 257/758; 257/E23.17

(58) Field of Classification Search ............. 257/531, 257/776, 664, 758, E23.17
See application file for complete search history.

(56) References Cited

U.S. PATENT DOCUMENTS

| 5,559,360 | A | 9/1996 | Chiu et al. ............. 257/531 |
| 5,962,945 | A | 10/1999 | Krenzer et al. ............. 310/208 |
| 6,049,308 | A | * | 4/2000 | Hietala et al. ......... 343/700 MS |
| 6,124,624 | A | * | 9/2000 | Van Roosmalen et al. ... 257/531 |
| 6,388,188 | B1 | * | 5/2002 | Harrison ............. 174/27 |
| 6,987,307 | B2 | * | 1/2006 | White et al. ............. 257/508 |

FOREIGN PATENT DOCUMENTS

| DE | 197 27 758 A1 | 10/1998 |
| WO | WO 98/43258 A2 | 10/1998 |
| WO | WO 03/005381 A1 | 1/2003 |

* cited by examiner

*Primary Examiner*—Nitin Parekh
(74) *Attorney, Agent, or Firm*—Brinks Hofer Gilson & Lione

(57) ABSTRACT

An explanation is given of an integrated interconnect arrangement having a plurality of interconnects that cross over one another at two crossover sections. By virtue of this measure, it is possible to achieve a uniform current flow in all three interconnects even at very high frequencies.

23 Claims, 4 Drawing Sheets

INTEGRATED INTERCONNECT ARRANGEMENT

Figure 1:
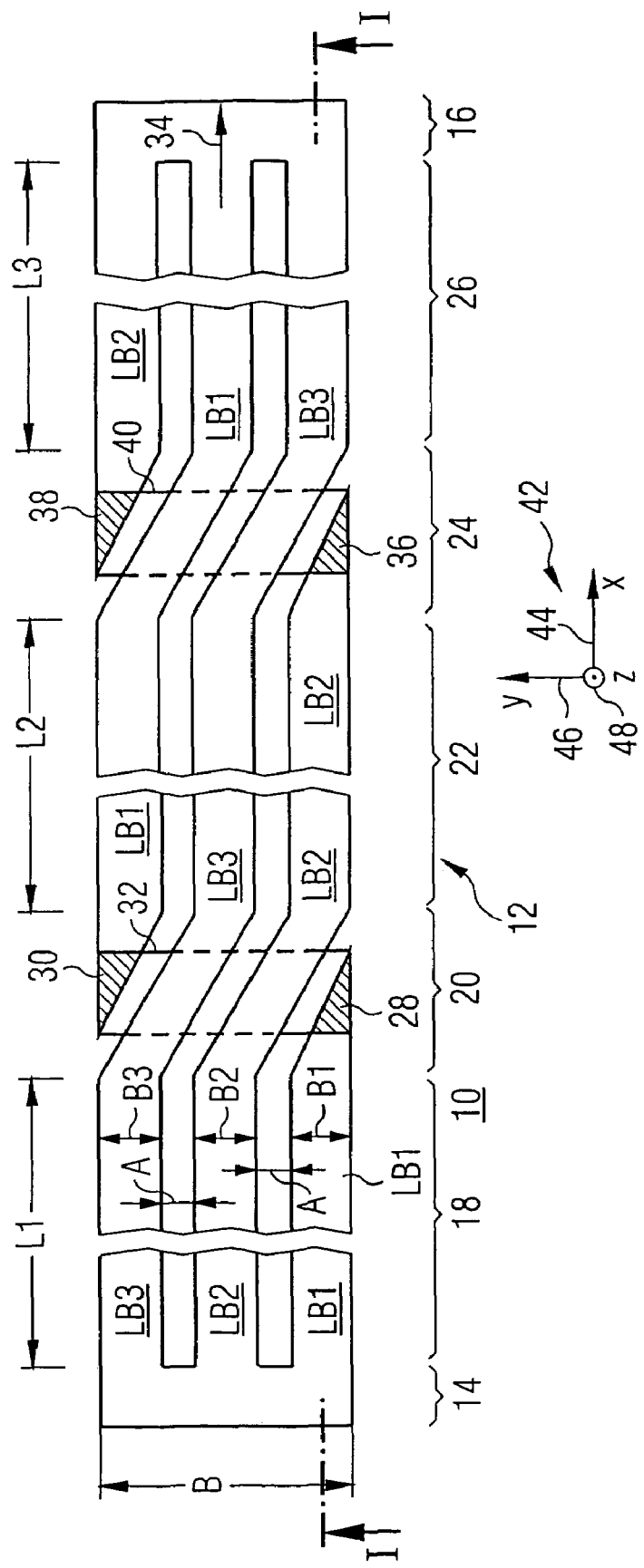

This application claims the priority of International Patent Application PCT/EP03/50070 filed on Mar. 19, 2003, which claims priority to German Patent Application 102 20 653.8 filed on May 8, 2002 and is incorporated herein by reference.

The invention relates to an integrated interconnect arrangement. The interconnect arrangement connects e.g. components of an integrated circuit arrangement or is itself a constituent part of an integrated component.

From an integrated arrangement, individual components cannot be separated from one another mechanically without destroying the components. The three main types of integrated circuit arrangements are:

monolithic circuit arrangements, in which components are also arranged in a semiconductor that serves as a carrier.

Layer or film circuits, in which thin films are used on an insulating carrier. A distinction is made between thin-film and thick-film circuits.

Hybrid circuits, which are a combination of the aforementioned circuit types.

Layer application methods and layer patterning methods are used, inter alia, as fabrication techniques for integrated arrangements. Examples of layer application methods are:

screen printing in the case of thick-film technology, or sputtering, the CVD method (Chemical Vapor Deposition) or the PVD method (Physical Vapor Deposition) in the case of monolithic circuit arrangements and thin-film circuits.

Examples of layer patterning methods are:

lithographic methods, or etching methods.

The interconnect of an interconnect arrangement has an electrical resistance of less than $10^{-4}$ ohm per centimeter for DC current. The interconnects are usually fabricated from aluminum, an aluminum alloy, copper or a copper alloy. These materials ensure that the interconnects generate the least possible ohmic losses, eddy current losses and other power losses.

It is an object of the invention to specify a simply constructed integrated interconnect arrangement which has, in particular, low power losses even at voltages or currents with a high frequency. Moreover, the intention is to specify associated uses.

The object related to the interconnect arrangement is achieved by means of the interconnect arrangement specified in patent claim 1. Developments are specified in the subclaims.

The invention is based on the consideration that as the frequency increases in integrated interconnect arrangements it becomes more and more difficult, on account of electrodynamic phenomena, to fabricate low-impedance connecting arrangements or connecting arrangements that cause low power losses.

The two main electrodynamic phenomena are the skin effect and the proximity effect. If AC current flows through a conductor, then an alternation conducting magnetic field also occurs, which induces in the conductor a countervoltage that is greatest in the center of the conductor. On account of said countervoltage, the current is distributed nonuniformly over the conductor. The current density rises from the center of the conductor toward the edge. This phenomenon is called current displacement or the skin effect. As a result of the current displacement, the conductor cross section is only partly utilized by the AC current. Reducing the effective conductor cross section increased the effective resistance of the conductor.

If currents having an identical or opposite direction flow in adjacent conductors, then a current displacement toward the edge of the conductor arrangement or toward the center of the conductor arrangement occurs in addition to the skin effect on account of the alteration of the magnetic fields. The high-frequency resistance of the relevant conductors is thereby increased again.

Moreover, the invention is based on the consideration that the current penetration depth into the conductor, for example for copper, is greater than two micrometers below a frequency of one gigahertz. This means that in the case of the structures that have usually been utilized heretofore with structure widths of approximately two micrometers or less, the two phenomena mentioned do not have a considerable influence on power losses. However, if it is desired to transmit signals in the frequency range of, for example, one gigahertz to 50 gigahertz, a considerable rise in the line resistance can be ascertained on account of the current displacement mechanisms even in the case of structure dimensions of less than two micrometers.

Simple connecting of interconnects in parallel, which interconnects also run spatially parallel, does not reduce the power losses because the central interconnects of the interconnect arrangement cannot contribute to the current flow on account of the current displacement mechanisms mentioned. The current flows, as already explained, only in the outer interconnects.

The interconnect arrangement according to the invention therefore contains at least three interconnects electrically connected in parallel. An electrical insulating material is arranged between the interconnects. Moreover, the interconnect arrangement contains at least two crossover sections arranged at different locations on the longitudinal axis of the interconnect arrangement, interconnects of the interconnect arrangement crossing over one another at said crossover sections.

By virtue of the multiple crossover, the interconnects of the interconnect arrangement can be arranged e.g. in the manner of a transposition or twisting of all the interconnects about the longitudinal axis of the interconnect arrangement, in the manner of an interlacing in which the interconnects are arranged alternately over another interconnect and under another interconnect progressively in the direction of the longitudinal axis of the interconnect arrangement, or in the manner of an interweaving. On account of the crossovers, the interconnects assume different positions within the interconnect arrangement. The multiple crossover has the effect that each interconnect contributes to the current flow even at very high frequencies. The power losses, in particular the ohmic losses, are reduced by virtue of the multiple crossover.

In one development of the interconnect arrangement according to the invention, the interconnects of the interconnect arrangement are lined up in one plane transversely with respect to the longitudinal direction of the interconnect arrangement outside the crossover sections. Interconnects arranged in this way can be fabricated in a simple manner by the two-dimensional patterning methods of the integrated technology that are customarily used. Thus, the interconnects can be arranged one beside the other in one metallization layer or else one above the other in different metallization layers.

In a next development, the interconnects are arranged in a metallization layer between adjacent crossover sections. The metallization layer lies parallel to the main area of a semiconductor substrate on which integrated components are situated. The interconnects lying in one metallization layer are produced simultaneously i.e. by means of the same deposition and patterning processes.

In one development of the interconnect arrangement having interconnects in one metallization layer, at the crossover sections, one interconnect is arranged transversely with respect to all of the other interconnects of the interconnect arrangement. The transverse interconnect or the other interconnects are arranged in another metallization layer. It is thus possible to fabricate a crossover section with just two metallization layers. If the transverse interconnect lies in the additional metallization layer, then only two additional contact holes are required. Since the contact-making in the region of the contact holes leads to an additional resistance, there is only an insignificant increase in the total resistance when there are only two contact holes per crossover section.

In another development, the other interconnects lie in a different direction at or within the crossover sections than outside the crossover sections. By way of example, the longitudinal direction of the interconnect changes at the crossover section firstly by a specific magnitude in a specific direction. The direction of the longitudinal axis of the interconnect changes again at the other end of the crossover section, the direction of the change in direction here being opposite to the first change in direction and the magnitude of the change in direction remaining the same. What is achieved by this measure is that the interconnect is offset in the crossover section. The offset gives rise to space that is utilized by the interconnect that is led in the crossover section transversely with respect to the other interconnects. Overall, as a result of this arrangement, the width of the interconnect arrangement is determined only by the width of the interconnects and the width of the insulations between the interconnects. However, the other interconnects can also be arranged in a different way at the crossover section.

In an alternative development, the interconnects are arranged in different metallization layers outside the crossover sections. By way of example, the interconnects lie one above the other in the normal direction with respect to a main area of a semiconductor substrate of the integrated circuit arrangement. By virtue of this measure, it is possible to arrange the interconnects with a small area requirement with regard to the surface of the semiconductor substrate. Moreover, it is possible to achieve a good capacitive decoupling between the interconnects of the interconnect arrangement.

In one development having interconnects in different metallization layers, at the crossover sections, one interconnect is arranged in a contact hole transversely with respect to all of the other interconnects. The contact hole preferably leads as far as a further metallization layer.

In one development having the interconnect led in the contact hole transversely with respect to the other interconnects, the interconnects of the interconnect arrangement, in the crossover sections, are in each case led from one metallization layer into a respectively adjacent metallization layer, for example uniformly into the metallization layer laying closer to the substrate or into the metallization layer lying further away from the substrate.

In another development, the interconnect arrangement contains precisely two crossover sections. It is thereby possible to reduce the number of contact holes within the interconnect arrangement. The fabrication method is simplified and the power losses decrease.

In one refinement, the two crossover sections are arranged at one third of the length of the interconnect arrangement and at two thirds of the length of the interconnect arrangement.

What can be achieved by this measure is that the current flow is distributed uniformly between the interconnects independently of the frequency, i.e. in particular even at very high frequencies, i.e. between one gigahertz and 50 gigahertz or higher.

In a next development of the integrated interconnect arrangement, all the crossover sections have essentially the same structure. Alternatively or cumulatively, the sections of the interconnect arrangement that lie outside the crossover sections also have identical spatial structures among one another. This measure simplifies the method for fabricating the circuit arrangement because, by way of example, only mask patterns for one crossover section have to be defined. Identical patterns are then utilized for all of the crossover sections.

In another development, each interconnect is arranged the same length between other interconnects. Alternatively or cumulatively, each interconnect is arranged the same length at the edge of the interconnect arrangement. These measures can be used to ensure that the current is distributed uniformly over all of the interconnects even at frequencies in the gigahertz range.

In another development, the largest lateral dimension of an interconnect transversely with respect to the longitudinal direction of the interconnect arrangement is less than ten micrometers or less than five micrometers. Alternatively or cumulatively, the length of the interconnect arrangement is less than ten millimeters or less than one millimeters. As a result, the area of application of the circuit arrangement lies not only in the thick-film area, in which thicknesses of greater than 50 micrometers to about 1 millimeter are typically used, but also in the area of monolithic circuits and thin-film technology.

The invention additionally relates to the use of the interconnect arrangement as a coil and also as signal routing to an antenna of a transmitting part or from an antenna of a receiving part. The use as a coil affords the advantage that the quality factor of the coil and thus also the quality factor of a resonant circuit containing the coil become very high even at frequencies in the gigahertz range. The use of the interconnect arrangement as part of the signal routing to an antenna or from an antenna permits feed lines that have previously been embodied in discrete fashion now also to be integrated into the circuit arrangement. The highest frequencies of the circuit arrangement, for example frequencies in the gigahertz range, occur precisely in the region of the antenna.

Figure 2:
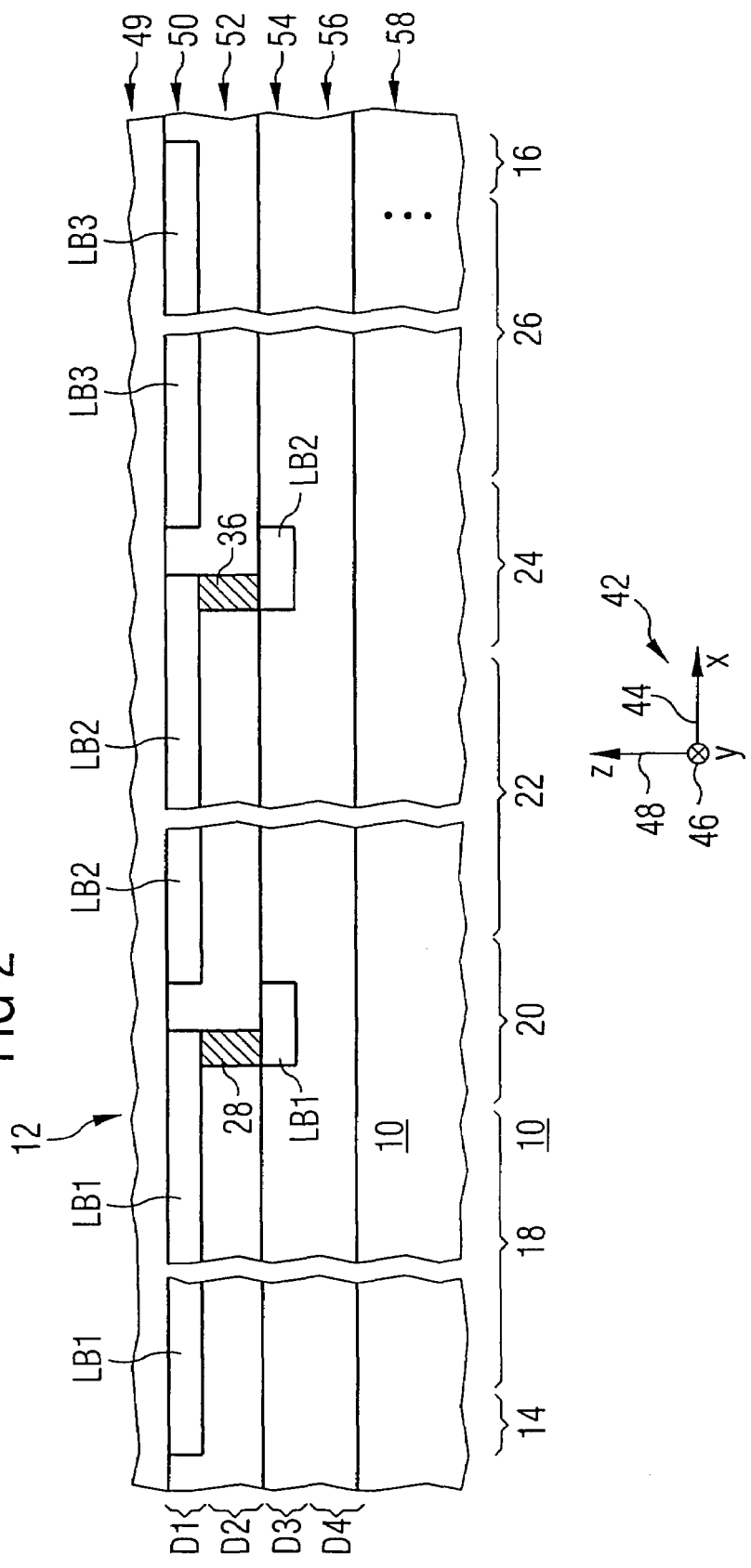
Figure 3:
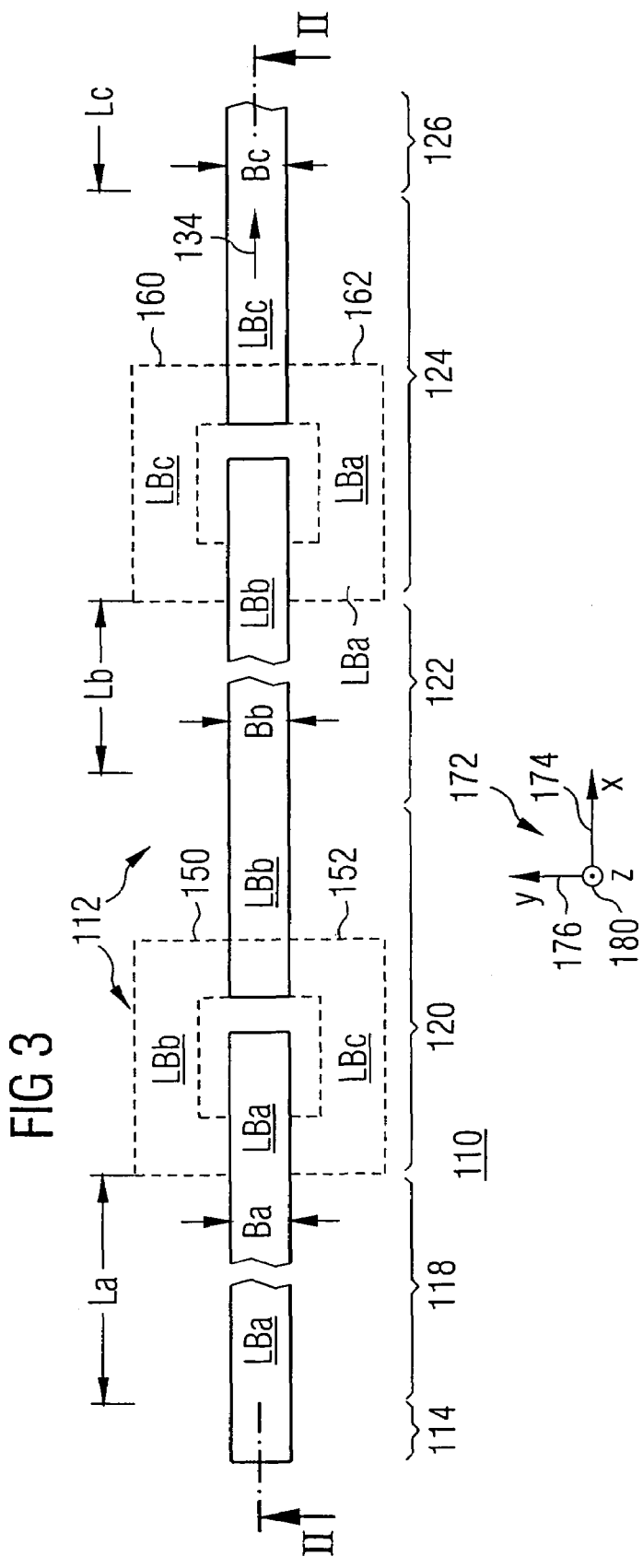
Figure 4:
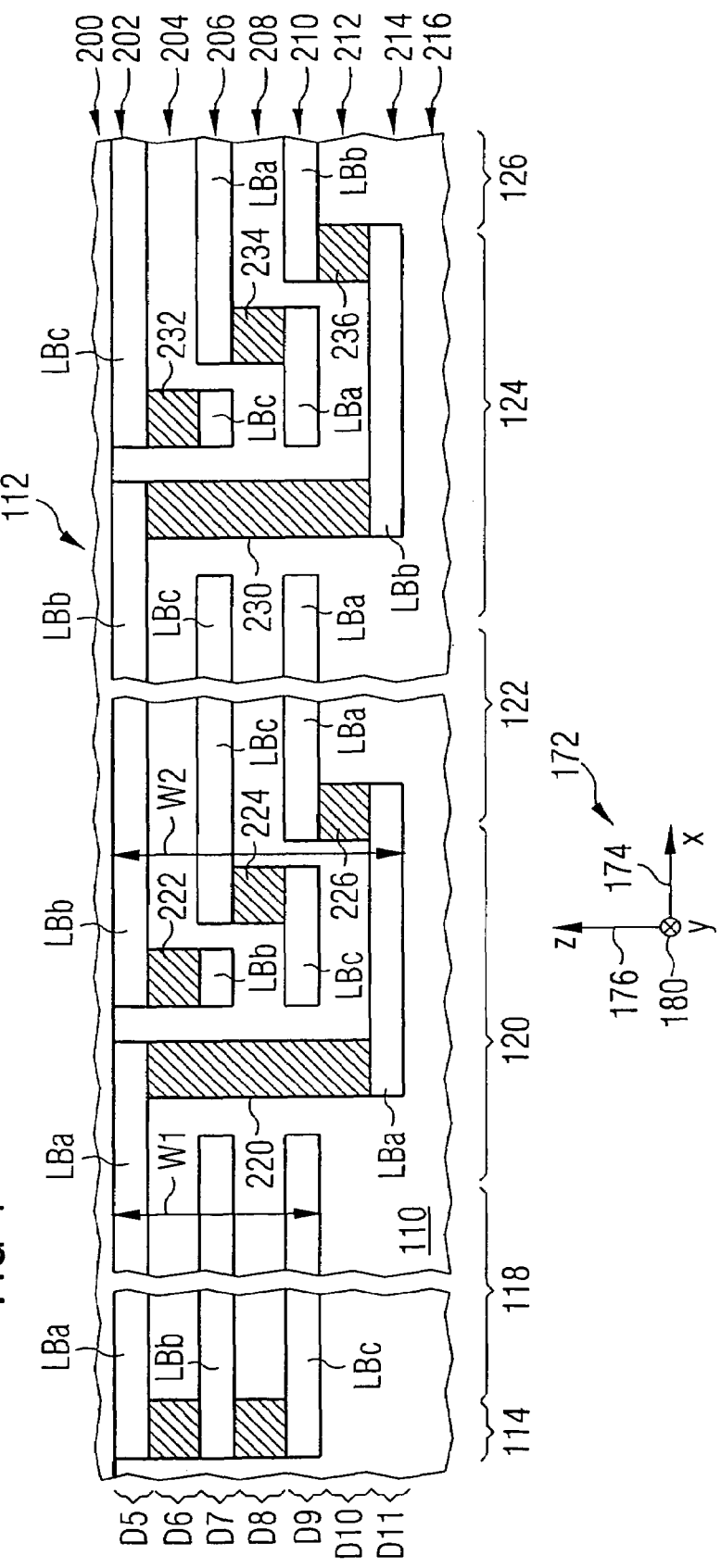

Developments of the invention are explained below with reference to the accompanying drawings, in which:

FIG. 1 shows a plan view of an integrated line whose interconnects are arranged in one metallization layer outside crossover sections, FIG. 2 shows a cross section through the integrated line from FIG. 1, FIG. 3 shows a plan view of an integrated line whose interconnects are arranged in three metallization layers outside crossover sections, and FIG. 4 shows a cross section through the integrated line from FIG. 3.

FIG. 1 shows a plan view of an integrated circuit arrangement 10 containing an integrated line 12. The integrated line 12 contains three interconnects LB1 to LB3 electrically connected in parallel in connection sections 14 and 16. Arranged between the connection sections 14 and 16 are, in the following order, an end section 18, a crossover section 20, a central section 22, a crossover section 24 and an end section 26. In the end sections 18 and 26 and also in the central section 22, the interconnects LB1 to LB3 are arranged parallel to one another in an upper metallization layer 50, also see FIG. 2.

The crossover section 20 contains contact hole regions 28 and 30, at the bottom of which a respective section 32 of the interconnect LB1 ends. The section 32 is at right angles to a longitudinal axis 34 of the line 12 below the interconnects LB2 and LB3 in a lower metallization layer 54, also see FIG. 2. At their other end, the contact hole regions 28 and 30 respectively adjoin sections of the interconnect LB1 that lie in the metallization layer 50, the sections of the interconnect LB1, proceeding from the end section 18 and from the central section 22, respectively tapering in a wedge-shaped manner toward the contact hole regions 28 and 30 in the crossover region.

While the longitudinal direction of the interconnects LB1 to LB3 corresponds to the direction of the longitudinal axis 34 in the end sections 18, 26 and in the central section 22, the interconnects LB2 and LB3 are arranged obliquely with respect to the longitudinal axis 34 at an angle of between 20 and 60 degrees, for example of 30 degrees, in the crossover section 20. The angle is dimensioned such that, seen over the length of the crossover section 20, the result is precisely an offset of the interconnect LB2 and of the interconnect LB3, respectively, of the width of an interconnect plus a distance A between adjacent interconnects. On account of the offset, the interconnect LB1 can take up in the central section 22 the position which the interconnect LB3 has in the end section 18.

The crossover section 24 is patterned precisely in the same way as the crossover section 20. Two contact hole regions 36 and 38 are situated in the crossover section 24, the contact hole bottom of said contact hole regions ending at a section 40 of the interconnect LB2. The section 40 is at right angles to the longitudinal axis 34. At their upper end, the contact hole regions are delimited by sections of the interconnect LB2 which lie in the metallization layer 50. In the crossover section 24, the interconnects LB1 and LB3 are arranged parallel to one another but obliquely with respect to the longitudinal axis 34 at an angle of about 30 degrees such that the interconnect LB1 and the interconnect LB3, respectively, are offset by an interconnect width and by the distance A between adjacent interconnects.

A type of transposition of the interconnects LB1, LB2, LB3 is achieved by means of the routing of the interconnects LB1, LB2, LB3 just explained. A length L1 of the end section 18, a length L2 of the central section 22 and a length L3 of the end section 26 are identical, so that each interconnect LB1, LB2, LB3 lies between the other interconnects LB1, LB2, LB3 precisely in an end section 18 and in the central section 22, respectively. By way of example, the interconnect LB3 lies between the interconnects LB1 and LB2 only in the central section 22. In the exemplary embodiment, the lengths L1, L2, and L3 are 100 micrometers in each case. By contrast, the crossover sections 20 and 24 are less than one-fifth of said length, e.g. ten micrometers. Here, the total length of the interconnect arrangement is less than 1 millimeter. In other embodiments, the total length of the interconnect arrangement may be less than ten millimeters.

Widths B1, B2 and B3 of the interconnects LB1, LB2 and LB3 respectively, are identical in the end sections 18, 26 and in the central section 22, respectively, for example one micrometer. An insulation distance A between adjacent interconnects LB1 to LB3 is 0.5 micrometer, for example. The total width B of the line 12 results from the sum of the widths B1 to B3 and twice the insulation distance A, i.e. four micrometers in the exemplary embodiment.

A system 42 of coordinates which is assigned to the circuit arrangement 10 exhibits an x axis 44, which lies in the plane of the drawing and corresponds to the direction of the longitudinal axis 34, a y axis 46, which lies at right angles with respect to the x axis 44 in the plane of the drawing, and a z axis 48 pointing in the direction of the normal to the plane of the drawing. FIG. 1 also shows the position of a cross section I, which intersects the line 12 in the x-z plane. The cross section I intersects the interconnect LB1 in the end section 18, the interconnect LB2 in the central section 22 and the interconnect LB3 in the end section 26.

FIG. 2 shows the cross section I through the line 12.

An insulating layer 49 is situated above the upper metallization layer 50 already mentioned with reference to FIG. 1. An insulating layer 52 is arranged between the upper metallization layer 50 and the lower metallization layer 54. An insulating layer 56 is situated below the lower metallization layer 54. A semiconductor substrate and, if appropriate, further metallization layers 58 and insulating layers are indicated by dots in FIG. 2. The upper metallization layer 50, the insulating layer 52, the metallization layer 54, and the insulating layer 56 have, in this order, thicknesses D1, D2, D3 and D4, respectively. In the exemplary embodiment, the thicknesses D1 and D3 are identical and are 0.5 micrometer, for example. In the exemplary embodiment, the thicknesses D2 and D4 of the insulating layer are also identical and are one micrometer, for example.

Other exemplary embodiments of the line 10 use more than three interconnects. The number of crossover sections then increases correspondingly. By way of example, four interconnects would result in three crossover sections. However, there are also lines having more than ten interconnects.

The multiple crossover sections 20, 36 interconnect LB1, LB2, LB3 to contribute to the current flow, even at high frequencies. At the crossover sections 20, 36, each interconnect LB1, LB2, LB3 will assume a new position with relation to the other interconnects. With multiple crossovers, the interconnects may be arranged in a transposition or twisting of the interconnects about the longitudinal axis of the arrangement. In one embodiment, the interconnects LB1, LB2, LB3 may be lined up transversely, side-by-side. In this manner, the interconnects LB1, LB2, LB3 may be fabricated as described previously in the two-dimensional pattern or array. In another embodiment to be discussed later, the interconnects may be placed one above the other in different metallization layers. The manner of the twisting may be in the form of interlacing in which the interconnects are arranged alternatively over another interconnect and under another interconnect progressively in the direction of the longitudinal axis of the interconnect arrangement. In a further embodiment, the crossovers may take the form of interweaving. Since the multiple crossover sections 20, 36 allow each interconnect to contribute to the current flow, the power losses, due to the reduced resistance, may be reduced by the virtue of the multiple crossovers.

In one embodiment, the two crossover sections 20, 36 are arranged at one third of the length of the interconnect arrangement and at two thirds of the length of the interconnect arrangement. The current flow is distributed uniformly between the interconnects independent of the frequency, even at high frequencies, in particular, at frequencies between one gigahertz and fifty gigahertz and higher. This includes frequencies greater than 500 gigahertz.

FIG. 3 shows a plan view of an integrated circuit arrangement 110 containing an integrated line 112. The integrated line 112 contains three interconnects LBa to LBc electrically connected in parallel in a connection section 114 at the left-hand end of the line 112 and at a connection section (not illustrated) at the other end of the line 112. Lying between the connection sections 114 and 116 are, in the following order, an end section 118, a crossover section 120, a central section 122, a crossover section 124 and an end section 126.

Within the end section 118, 126 and within the central section 122, the interconnects LBa to LBc lie one above the other in three metallization layers 202, 206 and 210 in the direction of the normal to a semiconductor substrate of the circuit arrangement 110, see also FIG. 4. Accordingly, FIG. 3 illustrates only the respective upper interconnects, i.e. the interconnect LBa in the end section 118, the interconnect LBb in the central section 122 and the interconnect LBc in the end section 126.

In the crossover section 110, on one side of the line 112 there is a bypass section 150 of the interconnect LBb, said bypass section lying in the metallization layer 206. With the aid of the bypass section 150, the interconnect LBb is led past a contact hole region 220, which is explained in more detail below with reference to FIG. 4.

Situated on the other side of the line 112 is a bypass section 152 of the interconnect LBc. The bypass section 152 lies in the metallization layer 210. With the aid of the bypass section 152, the interconnect LBc is led past the contact hole region 220. Moreover, contact hole regions 222, 224 and 226 that are likewise illustrated in FIG. 4 are situated in the crossover section 120.

The crossover region 124 is patterned precisely in the same way as the crossover region 120. In the crossover region 124, the interconnect LBb is led downward in a contact hole region 230 that is explained in more detail below with reference to FIG. 4. A bypass section 160 of the interconnect LBc lies on one side of the line 112 in the crossover section 124 in the metallization layer 206. The bypass section 160 leads the interconnect LBc past the contact hole region 230 and then back to the longitudinal axis 134 of the line 112. On the other side of the line 112, a bypass section 162 of the interconnect LBa lies in the crossover section 124. The bypass section 162 lies in the metallization layer 210 and leads the line LBa past the contact hole region 230.

The end section 118, the central section 122 and the end section 126 have a length La, Lb and Lc, respectively. The lengths La, Lb and Lc are identical and are 50 micrometers in the exemplary embodiment. The crossover sections 120 and 124 are short, for example just ten micrometers, in comparison with the length of the end sections 118, 126 and of the central section 122, respectively. The interconnects LBa, LBb and LBc have widths Ba, Bb and Bc, respectively, which are identical and are one micrometer, for example, in the exemplary embodiment.

A system 172 of coordinates exhibits an x axis 174 lying in the longitudinal direction 134 of the line 112. A y axis 176 lies at right angles to the x axis 174. A z axis 180 points in the direction of the normal to the plane of the drawing or in the direction of the normal to the main area of a semiconductor substrate of the circuit arrangement 110. FIG. 3 depicts the position of a cross section II, which lies in the x-z plane and intersects all of the interconnects LBa to LBc in the end section 118, in the central section 122 and in the end section 126, respectively.

FIG. 4 shows the cross section II through the line 112. FIG. 4 illustrates, from the top to a semiconductor substrate (not illustrated) an insulating layer 200, the metal layer 202, an insulating layer 204, the metal layer 206, an insulating layer 208, the metal layer 210, an insulating layer 212, a metal layer 214 and an insulating layer 216. The insulating layers 200, 204, 208, 212 and 216 contain silicon dioxide for example as insulating material. The metal layer 202, the insulating layer 204, the metal layer 206, the insulating layer 208, the metal layer 210, the insulating layer 212 and the metal layer 214 have, in this order, thicknesses D5, D6, D7, D8, D9, 10 and D11, respectively. The thicknesses D5, D7, D9 and D11 of the metal layers are identical and are 0.5 micrometer, for example. The thicknesses D6, D8 and D10 of the insulating layers are likewise identical and are one micrometer, for example.

In the end section 118, in the central section 122 and in the end section 126, the line 112 has a width W1 resulting from the addition of the thicknesses D5 to D9, i.e. a width W1 of 3.5 micrometers in the exemplary embodiment.

In the crossover region 120 and in the crossover region 124, by contrast, the line 112 has a width W2 resulting from addition of the thicknesses D5 to D11, i.e. a width W2 of six micrometers in the exemplary embodiment.

In other exemplary embodiments, the bypass sections 150 to 162 lie on the same side of the line 112. Moreover, the lower interconnect can be led upward in the crossover sections 120 and 124, respectively.

The number of interconnects of the type of line explained with reference to FIGS. 3 and 4 is limited by the number of available metallization layers. By way of example, it is possible to use four interconnects, three crossover sections then being necessary. However, there are also integrated circuit arrangements having six or eight metallization layers, so that the number of interconnects can be increased further.

To summarize, it must be emphasized that, in the exemplary embodiments, although an additional resistance arises as a result of the contact hole or VIA structures, the total conductance is increased even for high frequencies. The total conductance can be increased further by increasing the interconnect width B or the interconnect width W1 by utilizing additional interconnects. If use were made exclusively of interconnects routed in a parallel fashion, then widening the line would no longer have a positive effect starting from the point in time from which the penetration depth of the current, on account of the skin effect or the proximity effect, is less than half the interconnect width of the interconnects in the line. Electrodynamic simulations with field calculation programs confirm this. This means that low-impedance connecting lines can be built even for high frequencies, or that their conductance to a good approximation scales with the total width of the line.

The invention claimed is:

1. An integrated circuit interconnect arrangement for high frequency operation comprising:
   at least three interconnects electrically connected in parallel in a plane, the electrical connection being in a direction which is transverse to a longitudinal axis of the interconnect arrangement, the at least three interconnects being connected at respective end sections;
   an electrical insulating material arranged between the interconnects excluding the end sections and
   at least two crossover sections arranged at different locations on the longitudinal axis of the interconnect arrangement, where the interconnects of the interconnect arrangement cross over one another at the crossover section, each interconnect being arranged to have the same length between other interconnects, each interconnect being arranged at the same length at the end sections of the interconnect arrangement wherein the interconnects are lined up transversely to the longitudinal axis of the interconnect arrangement, wherein the lined up interconnects are arranged in the plane.

2. The interconnect arrangement of claim 1, wherein the interconnects are arranged in a metallization layer between adjacent crossover sections.

3. The interconnect arrangement of claim 1, wherein at the crossover section one of the at least three interconnects is arranged transversely with respect to the other interconnects, and where, in the crossover section, the transversely arranged interconnect and the other interconnects are arranged in different metallization layers.

4. The interconnect arrangement of claim 3, wherein the other interconnects are arranged in a different direction in a crossover section than outside the crossover section.

5. The interconnect arrangement of claim 1, wherein the interconnects are arranged in different metallization layers outside the crossover sections.

6. The interconnect arrangement of claim 5, wherein at the crossover section an interconnect is arranged in a contact hole transverse to the other interconnects and the contact hole leads to a further metallization layer.

7. The interconnect arrangement of claim 6, wherein the interconnects in the crossover section are led from one metallization layer to an adjacent metallization layer.

8. The interconnect arrangement of claim 1, wherein interconnect arrangement contains two crossover sections, and wherein the interconnect arrangement has a length measured from a first end section of the interconnect arrangement to a second end section of the interconnect arrangement, and wherein one crossover section lies at one-third of the length of the interconnect arrangement and the other crossover section lies at two-thirds of the length of the interconnect arrangement.

9. The interconnect arrangement of claim 1, wherein the crossover sections are patterned identically.

10. The interconnect arrangement of claim 1, wherein the interconnect arrangement that lies outside the crossover sections are patterned identically.

11. The interconnect arrangement of claim 1, wherein each interconnect section is arranged having a same length when between other interconnects.

12. The interconnect arrangement of claim 1, wherein each interconnect section is arranged having a same length when at the end sections of the interconnect arrangement.

13. The interconnect arrangement of claim 1, wherein the interconnects are arranged such that the same amount of current flows through each interconnect.

14. The interconnect arrangement of claim 1, wherein the arrangement conducts a current with a frequency greater than about one gigahertz.

15. The interconnect arrangement of claim 1, wherein the arrangement conducts a current with a frequency greater than about fifty gigahertz.

16. The interconnect arrangement of claim 1, wherein the arrangement conducts a current with a frequency greater than about five hundred gigahertz.

17. The interconnect arrangement of claim 1, wherein a largest lateral dimension of an interconnect is less than about 10 micrometers.

18. The interconnect arrangement of claim 17, wherein a length of the interconnect arrangement is less than about 10 millimeters.

19. The interconnect arrangement of claim 1, wherein a largest lateral dimension of an interconnect is less than about 1 micrometer.

20. The interconnect arrangement of claim 19, wherein a length of the interconnect arrangement is less than about 1 millimeter.

21. The interconnect arrangement of claim 1, wherein the interconnect is a constituent part of an integrated circuit arrangement further comprising a plurality of electronic components on a semiconductor substrate.

22. The interconnect arrangement of claim 1, wherein the interconnect arrangement is formed into a coil having an inductance.

23. The interconnect arrangement of claim 1, wherein the interconnect arrangement routes signals to an antenna of a transmitting part or routes signals from a receiving part.

* * * * *

UNITED STATES PATENT AND TRADEMARK OFFICE
CERTIFICATE OF CORRECTION

| | | |
|---|---|---|
| PATENT NO. | : 7,550,854 B2 | Page 1 of 1 |
| APPLICATION NO. | : 10/514145 | |
| DATED | : June 23, 2009 | |
| INVENTOR(S) | : Strasser | |

It is certified that error appears in the above-identified patent and that said Letters Patent is hereby corrected as shown below:

On the title page,

[*] Notice:   Subject to any disclaimer, the term of this patent is extended or adjusted under 35 USC 154(b) by (214) days Delete the phrase "by 214 days" and insert -- by 502 days --

Signed and Sealed this

Twenty-sixth Day of January, 2010

David J. Kappos
*Director of the United States Patent and Trademark Office*